(12) United States Patent
Hellemans et al.

(10) Patent No.: US 6,201,401 B1
(45) Date of Patent: *Mar. 13, 2001

(54) METHOD FOR MEASURING THE ELECTRICAL POTENTIAL IN A SEMICONDUCTOR ELEMENT

(75) Inventors: Louis C. Hellemans, Pellenburg; Thomas Trenkler, Leuven; Peter De Wolf, Eeklo; Wilfried Vandervorst, Mechelen, all of (BE)

(73) Assignee: IMEC (CH)

( * ) Notice: Subject to any disclaimer, the term of this patent is extended or adjusted under 35 U.S.C. 154(b) by 0 days.

This patent is subject to a terminal disclaimer.

(21) Appl. No.: 09/197,611

(22) Filed: Nov. 23, 1998

Related U.S. Application Data (63) Continuation-in-part of application No. 09/032,906, filed on Mar. 2, 1998, now Pat. No. 6,091,248, which is a continuation-in-part of application No. 08/673,616, filed on Jun. 25, 1996, now Pat. No. 5,723,981, which is a continuation of application No. 08/345,300, filed on Nov. 28, 1994, now Pat. No. 5,585,734, and a continuation of application No. 08/520,341, filed on Aug. 28, 1995, now abandoned.

(30) Foreign Application Priority Data

Aug. 29, 1997 (NL) ........................................ 9401390

(51) Int. Cl.$^7$ ............................................... G01R 31/26
(52) U.S. Cl. .................................... 324/719; 324/753
(58) Field of Search .................................... 324/719, 762, 324/752, 751, 763, 753

(56) References Cited

U.S. PATENT DOCUMENTS 5,585,734 * 12/1996 Meuris et al. ........................ 324/719
5,723,981 * 3/1998 Hellemans et al. ................. 324/719

* cited by examiner

*Primary Examiner*—Safet Metjahic
*Assistant Examiner*—James Kerveros
(74) *Attorney, Agent, or Firm*—Ostrolenk, Faber, Gerb & Soffen, LLP (57) ABSTRACT

Measuring an electrical potential in a semiconductor element by applying one or more voltages over the semiconductor element, placing at least one conductor in contact with the semi-conductor element using a scanning proximity microscope while injecting a substantially zero current in the semiconductor element with the conductor, measuring an electrical potential in the conductor while injecting a substantially zero current in the semiconductor element with the conductor, changing the position of the conductor, and repeating the measuring and changing steps.

33 Claims, 7 Drawing Sheets

Silicon

Fig. 3 (b)

Platinum

Fig. 3 (c)

Silicon
+ 4.5 nm SiO$_2$

TOPOGRAPHY SIGNAL

Fig. 9 (a)

POTENTIAL SIGNAL

Fig. 9 (b)

METHOD FOR MEASURING THE ELECTRICAL POTENTIAL IN A SEMICONDUCTOR ELEMENT

CROSS REFERENCE TO RELATED APPLICATIONS

This application is a continuation-in-part of U.S. Ser. No. 09/032,906, filed Mar. 2, 1998, now U.S. Pat. No. 6,091,248 and entitled METHOD FOR MEASURING THE ELECTRICAL POTENTIAL IN A SEMICONDUCTOR ELEMENT (the '906 application), which is a continuation-in-part of U.S. Ser. No. 08/673,616, filed Jun. 25, 1996 and entitled METHOD FOR MEASURING THE ELECTRICAL POTENTIAL IN A SEMICONDUCTOR ELEMENT, now U.S. Pat. No. 5,723,981 (the '616 application), which is a continuing application of U.S. Ser. No. 08/345,300, filed Nov. 28, 1994 and entitled METHOD FOR RESISTANCE MEASUREMENTS AND CARRIER PROFILING OF A SEMICONDUCTOR ELEMENT, now U.S. Pat. No. 5,585,734 (the '300 application) and of U.S. Ser. No. 08/520,341, filed Aug. 28, 1995 and entitled METHOD AND DEVICE FOR MEASURING THE CHARGE CARRIER DISTRIBUTION IN THE SEMICONDUCTOR ELEMENT, now abandoned (the '341 application). The entire respective disclosures of the '906, '616, the '300 and the '341 applications are hereby incorporated by reference.

FIELD OF THE INVENTION

The present invention describes a method for the electrical characterization of semiconductor elements with a very high resolution. More particularly a method is disclosed for measuring the electrical potential and the electrical potential distribution in a semiconductor element with a resolution of the order of nanometers.

BACKGROUND OF THE INVENTION

With ever decreasing feature size of semiconductor devices, the potential distribution in the device during operation and related properties such as the electrical field distribution and the extent of space-charge regions next to junctions are of great interest. Knowledge of these quantities with nanometer resolution becomes crucial for activities such as TCAD device simulator development and also for manufacturing process evaluation. Simulation software for submicron devices needs reliable data provided by characterization techniques for calibration. Measurement techniques therefore must be simple, have a high spatial resolution and sensitivity, have to be applicable to both conducting and non-conducting samples, and be affected as little as possible by the corrections caused by the measuring instruments. A semiconductor element should be subjected to as few as possible preparation steps in order to allow for such measurements. It is furthermore a specific need for quality control during production and development of semiconductor elements to determine the spatial distribution of the electrically active charge carriers therein. In particular, after annealing of doped semiconductor elements it is uncertain which part of the dopants is of significance electrically and what is the actual spatial distribution of these charge carriers in the semiconductor element. Submicron device development and fabrication hinges on the tight control of dopant incorporation and (re)distribution during the whole fabrication process. Facing the increasing costs for processing, extensive usage of process and device simulation programs (TCAD) has become a standard in technology development. However since advanced processes contain numerous less well characterized processing steps (like short time anneals, transient diffusion, stress induced diffusion, 2D-diffusion . . . ), models are not yet completely predictive. Calibration of TCAD-tools and further model development are therefore essential activities for semiconductor companies involved in deep submicron technology. An important restriction in the successful application of this strategy is the availability of suitable characterization methods. With decreasing device dimensions the requirements posed on the analysis tools have increased from moderate requirements on 1D-depth resolution and sensitivity applied to simple test structures to very stringent requests related to 2D-resolution (nm!), quantification accuracy (2–5%) and the capability to probe directly on devices. Concurrent with the TCAD-needs are the demands from failure analysis for high spatial resolution analysis of devices.

Scanning proximity microscopes are known in the prior art. Said microscopes are capable of imaging the surface of a substrate with atomic resolution. Conventional scanning proximity microscopes provide signals which correspond to changes in the topography of the sample under investigation. Scanning probe technology already has gained wide access in the semiconductor fabrication particularly for surface roughness (with sub-nm sensitivity) and dimensional metrology. The extension from a pure topographical measurement towards a more functional analysis (carrier or potential profiling) by the (additional) acquisition of a relevant electrical signal might lead to a method satisfying the TCAD- and failure analysis needs in terms of the required 2D-resolution, electrical information and applicability to devices.

Techniques are known in the prior art by which the potential distribution of a semiconductor element can be measured. The paper *Scanning Tunneling Potentiometry*, Appl. Phys. Lett. 48, 514 (1986) by Muralt and Pohl discloses a method for measuring the potential distribution on conductor/semiconductor elements by using a scanning tunneling microscope (STM). In said method the different frequencies constituting the tunneling current between a conducting tip and the semiconducting/conducting element under investigation are separated in order to obtain electrical potential characteristics. Said method suffers from the disadvantage that the STM-tip does not make contact with the semiconducting/conducting element under investigation. Further, the measured potential distribution is disturbed by the tunneling current, injected in the semiconducting/conducting element under investigation. Said method furthermore is sensitive to the presence of contaminants present on the semiconducting/conducting element under investigation. M. Anders et al., in the paper *Potentiometry for Thin-Film Structures using Atomic Force Microscopy*, J. Vac. Sci. Technol.A8, 394 (1990) discloses a STM/AFM based noncontact potential measurement. Said method is disturbed by the tunneling current, injected in the semiconducting/conducting element under investigation and is sensitive to the presence of contaminants present on the semiconducting/conducting element under investigation. U.S. Pat. No. 5,122,739 discloses a method and apparatus for measuring node voltages on integrated circuits. Said method and apparatus are based on the STM-technique. Nonnenmacher et al. disclose in the paper *Kelvin Probe Force Microscopy*, Appl. Phys. Lett. 58, 2921 (1991) a method for measuring the contact potential difference between different materials using Kelvin Probe Force Microscopy. The prior art fails to disclose a method to measure the electrical potential in semiconductor element without disturbing said electrical potential. The cited references fail to disclose a method to measure the electrical potential in a semiconductor element that is insensitive to the presence of contaminants on the surface of the semiconducting/conducting elements under investigation. The cited references fail to disclose a method that is a method that allows simultaneous measurements of the topography and the potential distribution of semiconductor elements and related/derived characteristics thereof using a scanning proximity microscope in contact mode.

SUMMARY OF THE INVENTION

The present invention provides a new method for measuring the potential distribution in a semiconductor element. The present invention advantageously exploits the technology from conventional Atomic Force Microscopy (AFM) and/or Scanning Tunneling Microscopy (STM) combined with one or more conducting probes to map the potential distribution in a semiconductor element. The measured potential distribution can be used for applications such as process control, process optimization, TCAD device simulator calibration, the determination of charge carrier distributions in semiconductor elements and other applications.

For this purpose, the invention provides a method for measuring the electrical potential on a semiconductor element comprising the steps of applying one or more voltages over the semiconductor element and placing one or more conductors in contact with the semiconductor element using a scanning proximity microscope. An electrical potential in the semiconductor element is measured with at least one of the conductors while injecting a substantially zero current in said semiconductor element. The term "substantially zero current" as used herein and the claims means a lower value than the value of a tunneling current. In an embodiment of the invention, the contact force between the conductors and the semiconductor element is calibrated.

Advantageously, a scanning proximity microscope (SPM), such as an AFM (Atomic Force Microscope), is employed to keep the contact force and/or distance between the probe and the semiconductor element constant, and to move the probe and semiconductor element relative to each other. Because of the standard resolution of such a scanning proximity microscope is in the nanometer range, the present inventive method has been designated nanopotentiometry. Two or more conductors are held against predetermined positions on the semiconductor element and set to a predetermined voltage. External electrical equipment is connected to the probe element in order to perform the electrical potential measurement. The probe is scanned in a predetermined pattern across the semiconductor element while the scanning proximity microscope feedback loop maintains a constant distance and/or constant pressure force between the probe and the semiconductor element. This pattern can be one-dimensional or two-dimensional.

It is an aspect of the present invention to disclose a method that allows simultaneous measurements of the topography and the potential distribution of semiconductor elements and related/derived characteristics thereof using a scanning proximity microscope in contact mode. Hereby a mapping of the potential distribution at the surface of the semiconductor elements under investigation can be obtained. Hereby also a mapping of the potential distribution inside the semiconductor element under investigation can be obtained. By establishing a relation between electrical potential and charge carrier distribution, the charge carrier distribution in the semiconductor can be obtained by converting the mapped electrical potential distribution to charge carrier distribution. According to this aspect of the invention measurements are done on a cross section of an active transistor device (i.e. all bias voltages are applied) fabricated in a semiconductor element. The measurements include a mapping of the potential distribution using a conductive probe acting as a local voltage probe. If a small probe is used (<5–10 nm), a high spatial resolution analysis of the device becomes possible. Thus one obtains the potential distribution inside the transistor device which reflects directly the device operation and which can be compared with the result from a device simulator. Since the potential distribution is governed by the (two-dimensional) dopant distribution in the transistor device, it must be possible to extract from the potential measurements the dopant distribution as well. The static potential (and carrier) distribution, can be measured and using proper lock-in techniques one can probe the AC-behavior of the device as well. Thus the electric operation of a fully operational transition device by determining the potential distribution inside the structure can be characterized. The latter provides a close correlation with electrical device characteristics, allows verification of the predictions from a device simulator and, as the potential distributions are closely linked to the dopant distributions, enables the identification of dopant distributions and the calibration of process simulators in particular for two-dimensional effects. The result of this method greatly facilitate process and device development and sustain failure analysis for the next generations of Si-technology.

In another aspect of the invention, the invention provides a method for measuring the electrical potential distribution in a semiconductor element, comprising the steps of applying at least one voltage over the semiconductor element; placing at least one conductor in contact with the semiconductor element using a scanning proximity microscope while injecting a substantially zero current in the semiconductor element with the conductor; measuring the electrical potential on the conductor while injecting a substantially zero current in the semiconductor element with the conductor; and thereafter changing the position of the conductor in order to map the electrical potential distribution in the semiconductor element by measuring the electrical potential on the conductor at different positions on the semiconductor element.

In an embodiment of this latter aspect of the invention, the conductor is held in contact with the semiconductor element while the position of the conductor is changed. In this embodiment contact force is continuously applied between the conductor and the semiconductor element. In another embodiment of this aspect of the invention, a parameter characterizing contact between the semiconductor element and the conductor is monitored. The contact between the semiconductor element and the conductor includes electrical and mechanical contact. The parameter or the parameters characterizing contact between the semiconductor element and the conductor therefore include information on mechanical and electrical contact. These contact parameters can be calibrated for executing the method for measuring the electrical potential distribution in the semiconductor element. This calibration step can be executed in many ways and can include a calibration of contact force between the semiconductor element and the conductor or a calibration of the setpoint voltage of the scanning proximity microscope or any calibration of any way of contact monitoring, yielding as a result the execution of the electrical potential distribution measurements of the invention in a reliable way. The calibration step can include the step of determining a precise value of the contact parameter and can also include the step of determining a lower or an upper limit for the contact parameter in order to execute the method for measuring the electrical potential distribution in the semiconductor element in a reliable way.

BRIEF DESCRIPTION OF THE DRAWINGS

Further advantages, features and details of the present invention will become apparent on the basis of the following detailed description with reference to the annexed drawings, in which.

DETAILED DESCRIPTION OF PREFERRED EMBODIMENTS

Figure 1:
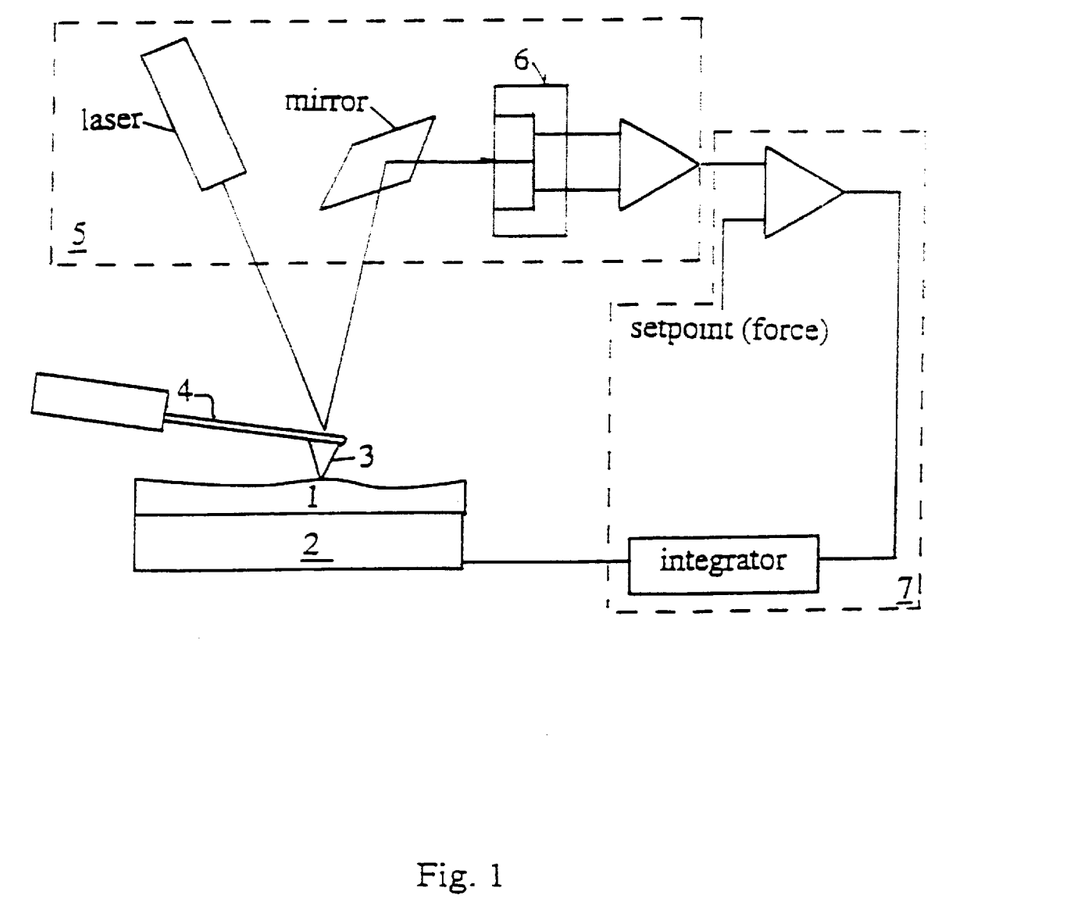
FIG. 1 is a schematic diagram of a measurement method using an Atomic Force Microscope (AFM) which can be used in carrying out a first aspect of the invention.

In order to carry out the measurement method in accordance with the invention, an Atomic Force Microscope (AFM) arrangement is used. The potential distribution is measured using a conductive AFM-tip as a local voltage probe. Since the spatial resolution is totally determined by the tip radius, usage of a conductive AFM-tip with a very small radius (<5 nm) is important. FIG. 1 shows the measurement apparatus according to an embodiment of the invention. A semiconductor element (1), which may comprise a transistor structure, is mounted movable three-dimensionally with a first piezo-crystal (2), which adjusts or calibrates the force or distance of a conducting needle (3) (referred to as "the probe") relative to the semiconductor element (1) making use of a feedback mechanism and which enables the movement of the probe over the surface of the semiconductor element. The feedback mechanism can be as follows. The probe is attached to a cantilever (4), whose deflection is measured by a deflection detection mechanism (5). Said deflection detection can be by laser-light reflection onto a segmented photo detector (6) as shown in FIG. 1, or by optical interferometry, or by capacitive deflection detection, or by tunneling detection, or with a second piezoresistive or piezocapacitive detection mechanism. Said deflection detection mechanisms produce a signal which is a measure for the deflection. This signal is fed back by a feedback loop (7) to the first piezo-crystal (2). The force between the probe and the semiconductor element can be held constant because of this feedback.

Using the first piezo-crystal (2) the probe (3) is moved over the surface of the semiconductor element (1) while the force or pressure or distance between the probe and the semiconductor element is held constant. The electrical potential measured on said probe (3) is recorded using external standard electrical equipment. In this way, essentially the entire spatial potential distribution in said semiconductor element can be measured. The potential distribution in said semiconductor element can originate from applied voltages between two or more contacts on said semiconductor element. The potential distribution can also originate from incident light, magnetic waves, electromagnetic waves, temperature, pressure or other sources using well known techniques. Also characteristic features within said semiconductor element such as depletion widths, junction positions, defects, grain boundaries, delineation of insulating and conducting layers and local band structure can become visible. Furthermore, the potential distribution can be used to derive related electrical properties such as the electrical field, carrier and dopant concentration, charge distribution and carrier lifetimes.

The arrangement of the present invention contemplates the use of several probes, each of them having their own deflection detection mechanism, feedback loop and electrical potential measurement unit.

Figure 2:
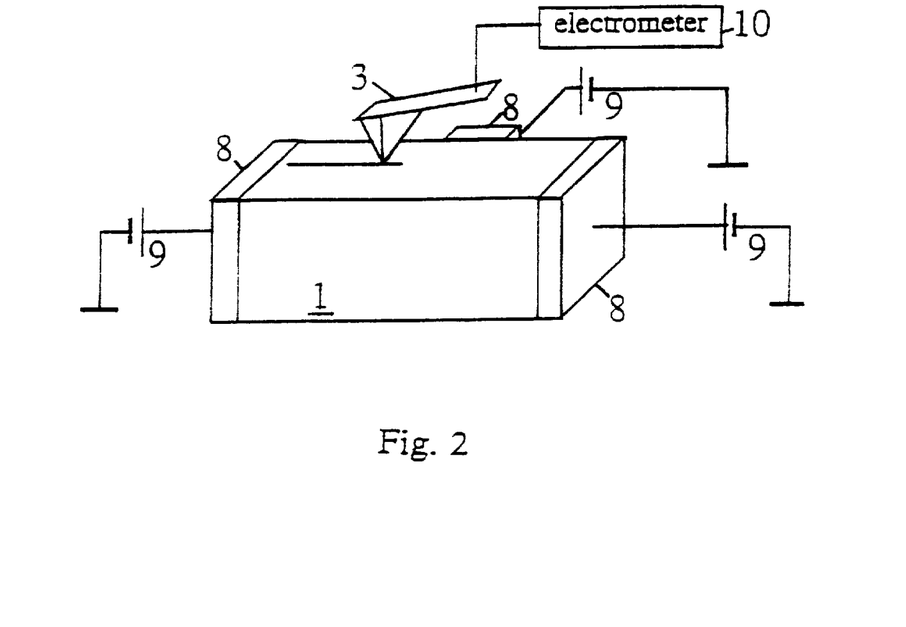
FIG. 2 is a schematic diagram which illustrates the measurement method in more detail.

FIG. 2 shows an example of a preferred embodiment in more detail. Only one probe (3) and three conductors (8) are shown. The conductors are attached to the semiconductor element (1) and set to predetermined voltages (9). The electrical potential on said probe (3) is measured by an electrometer (10).

Figure 3:
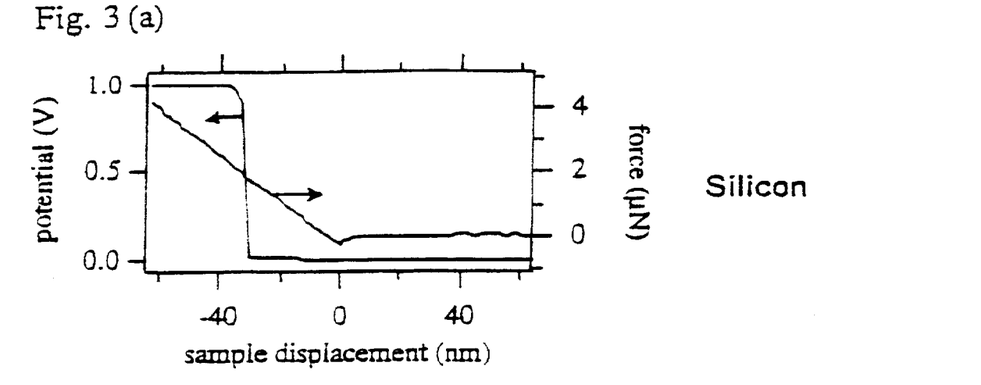
FIGS. 3(a)–3(c) show the electrical potential on the probe measured as function of the distance between the probe and the semiconductor elements under investigation.

The force or pressure or distance needed for reliable, reproducible measurement of the electrical potential can be determined or calibrated by monitoring the electrical potential on the probe while the probe approaches the semiconductor sample. From this curve, the minimum force or pressure or distance necessary for reliable, reproducible potential measurement can easily be determined or calibrated. FIG. 3a shows an example of a potential vs. sample displacement curve for a homogeneously doped silicon sample biased to 1 V. Also shown is the force acting on the probe as a function of sample displacement. Contact between sample and probe is characterized by a first substantial change in the force characteristic of the probe. One way of expressing said first substantial force change is as a non-zero first derivative of the force versus displacement curve. The potential measured on the probe shows a first substantial potential change as the force is further increased by lifting the sample towards said probe. The force corresponding to said first substantial potential change is taken as the calibrated minimum force required for executing reliable, reproducible potential measurements on the sample under investigation. The calibrated force needed for carrying out reliable measurements in this example therefore is about 2 $\mu$N. FIG. 3b shows an example of a potential vs. sample displacement curve for a platinum sample biased to 1 V. The calibrated force needed for carrying out reliable measurements in this example is between 100 nN and 1 $\mu$N. FIG. 3c shows an example of such a potential vs. sample displacement curve for a homogeneously doped silicon sample with a 4.5 nm thick SiO2, biased to 1 V. The calibrated force needed for carrying out reliable measurements in this example is about 3 $\mu$N. Within these calibration experiments, the measured potential is measured on a place of the sample under investigation where one expects to measure the same potential as the applied potential. After this calibration, the potential distribution in the semiconductor element under investigation can further be investigated by changing the position of the probe while keeping the force at the calibrated force value. It is obvious that the potential on a homogeneously doped sample, as used in the description hereabove is constant and not changing over the sample under investigation.

An example of use of the invention follows. In this example, the electrical potential distribution to be measured in the semiconductor element is caused by a voltage applied over said semiconductor element by applying a voltage between conductors attached to the semiconductor element.

Figure 4:
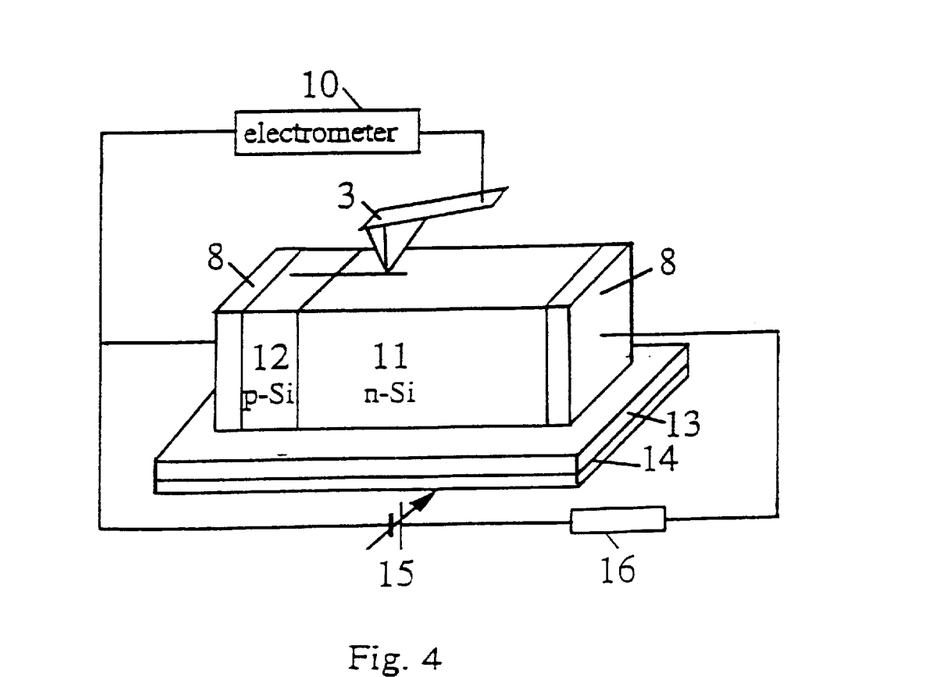
FIG. 4 is a schematic diagram of the setup used in a specific application.

Chosen as semiconductor element is a standard wafer of (100) silicon which consists of a boron-doped, epitaxially grown p-layer on a phosphorus-doped n-layer. A detailed measurement apparatus according to this preferred embodiment is shown in FIG. 4. Using the so-called Spreading Resistance Probe (SRP) technique it is determined that the p-n junction is situated at a depth of about 4.8 μm and the charge carrier concentration of the p-layer amounts to $2 \times 10^{17}/cm^3$ and of the n-layer to $1 \times 10^{15}/cm^3$. A portion of approximately 3 by 5 mm is broken off the wafer. Under the optical microscope a part of the fractured or cleaved face was found to be sufficiently flat to enable measurement thereon. The surface of the wafer was not prepared further.

In order to apply a potential difference over the p-n junction two contacts (8) were ultrasonically soldered to the semiconductor element: one to the n-type region (11) and one to the p-type region (12).

The broken-off part was attached to an insulating piece of glass (13) such that the cleaved surface of the p-n junction was exposed on the top. The piece of glass was adhered fixedly to a piece of steel (14) so that the sample could be clamped magnetically to the measuring arrangement of the atomic force microscope used.

The measurement results were obtained using an AFM device (in the present case a NanoScope II from Digital Instruments) with which the semiconductor sample can be moved relative to the measuring probe with nanometer accuracy while there is a substantially constant force between the tip of the measuring probe and the surface of the semiconductor element. In the chosen preferred embodiment the tip of the measuring probe (3) is manufactured from diamond which is implanted with boron and which is conductive. Alternatively, the tip of the probe (3) may be made of diamond, tungsten coated diamond, diamond-like-carbon, silicon, diamond-coated silicon, silicide-coated silicon, cubic boron-nitride and nitride-coated silicon.

The potential difference over the semiconductor element which comprises a p-type layer (12) on an n-type substrate (11) was applied using a battery (15) which is connected in series to a variable resistor/potentiometer designated schematically with (16) in order to be able to apply different setting voltages over the semiconductor element. The potential difference between the measuring probe (3) and the connection contact (8) on the p-layer was determined using an electrometer (10), in the present case of the type Keithley 617.

First the force needed for executing reliable, reproducible measurements were calibrated using the procedure detailed hereabove. The force calibration was executed on the semiconductor element under investigation comprising a p-type layer on an n-type substrate. The force is calibrated while placing the probe on such part of the semiconductor element under investigation where the same potential as the one applied was to be measured. Such part can be the n-region at large distance from the junction.

Thereafter, at a predetermined setting voltage and using an optical microscope, the tip of the measuring probe was placed in the region of the p-n junction in contact with the sample and held there against with said calibrated force, whereafter by means of a movement of the AFM piezo-crystal in one direction transversely of the junction the potential gradient at the tip of the probe (3) was determined as a function of the distance d over the junction with steps of 15 up to 50 nm according to the chosen embodiment.

Figure 5:
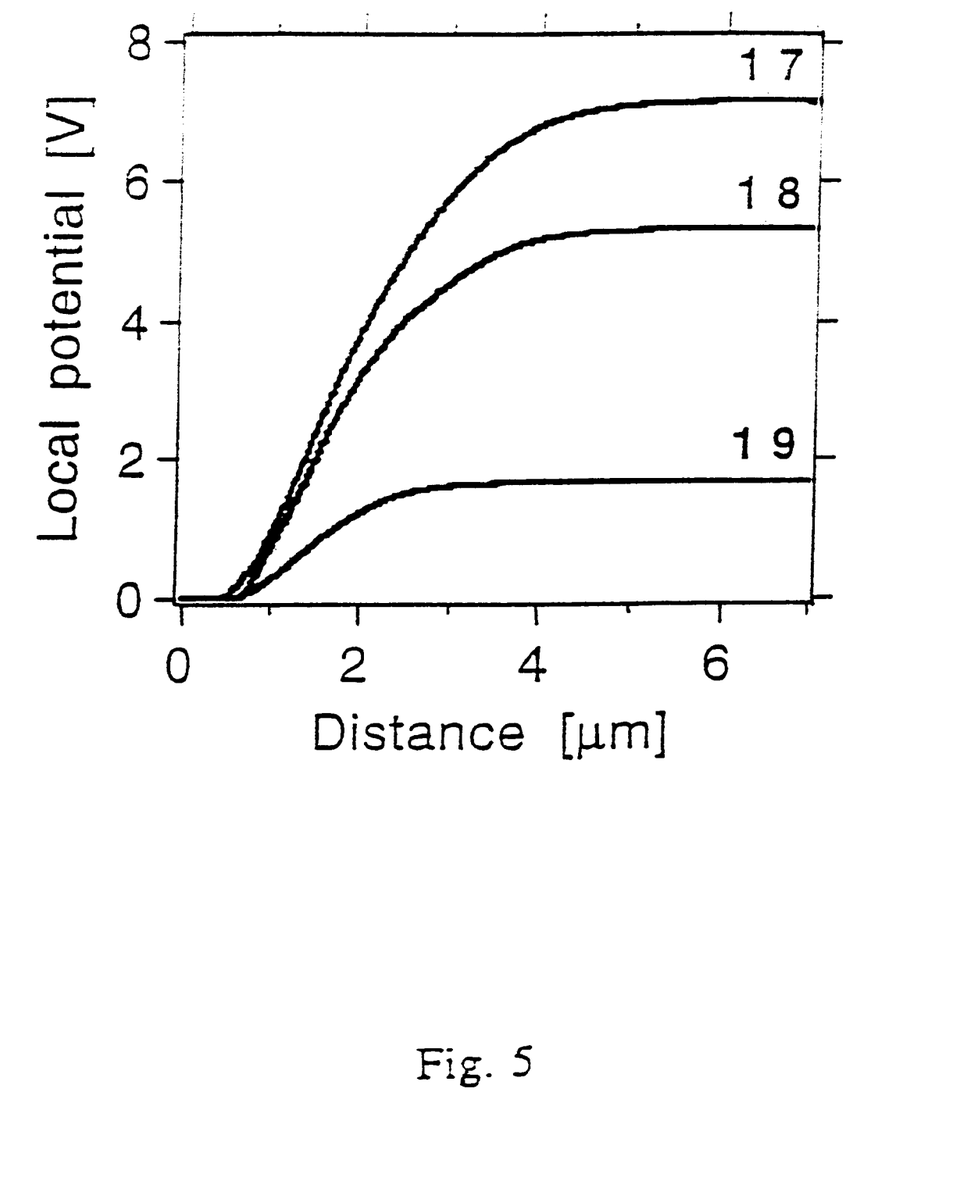
FIG. 5 shows a graph of the one-dimensional potential distribution results, measured on a p-n junction.

In FIG. 5 the measurement curves (17), (18) and (19) were measured in reverse bias mode at setting voltages of respectively 8.0, 6.0 and 2.0 Volt. In reverse bias mode the entire voltage drop is expected to occur across a shallow depletion layer in the region of the p-n junction. With an accuracy of more than 95% the semiconductor element was moved reciprocally in a direction transversely of the p-n junction through a distance of 7 μm at a frequency of 0.13 Hertz. It was observed that when the pressure force is increased, for instance doubled, the measurement results hardly vary from those shown in FIG. 5. From FIG. 5 it can also been seen that the depletion layer is extending deeper into the n-Si as the setting voltage increases according to the following formula:

$$X_n = \frac{\sqrt{\varepsilon_0 \varepsilon_s (V_{bi} + V)(N_A + N_D)}}{eN_A N_D}$$

where $x_n$ is the extension of the depletion layer into the n-Si, $\epsilon_o$ is the permittivity of vacuum, $\epsilon_s$ is the dielectric constant of silicon, $V_{bi}$ is the built-in voltage of the diode, V is the setting voltage, $N_A$ and $N_D$ are the acceptor and donor concentrations, and e is the elementary charge.

Figure 6:
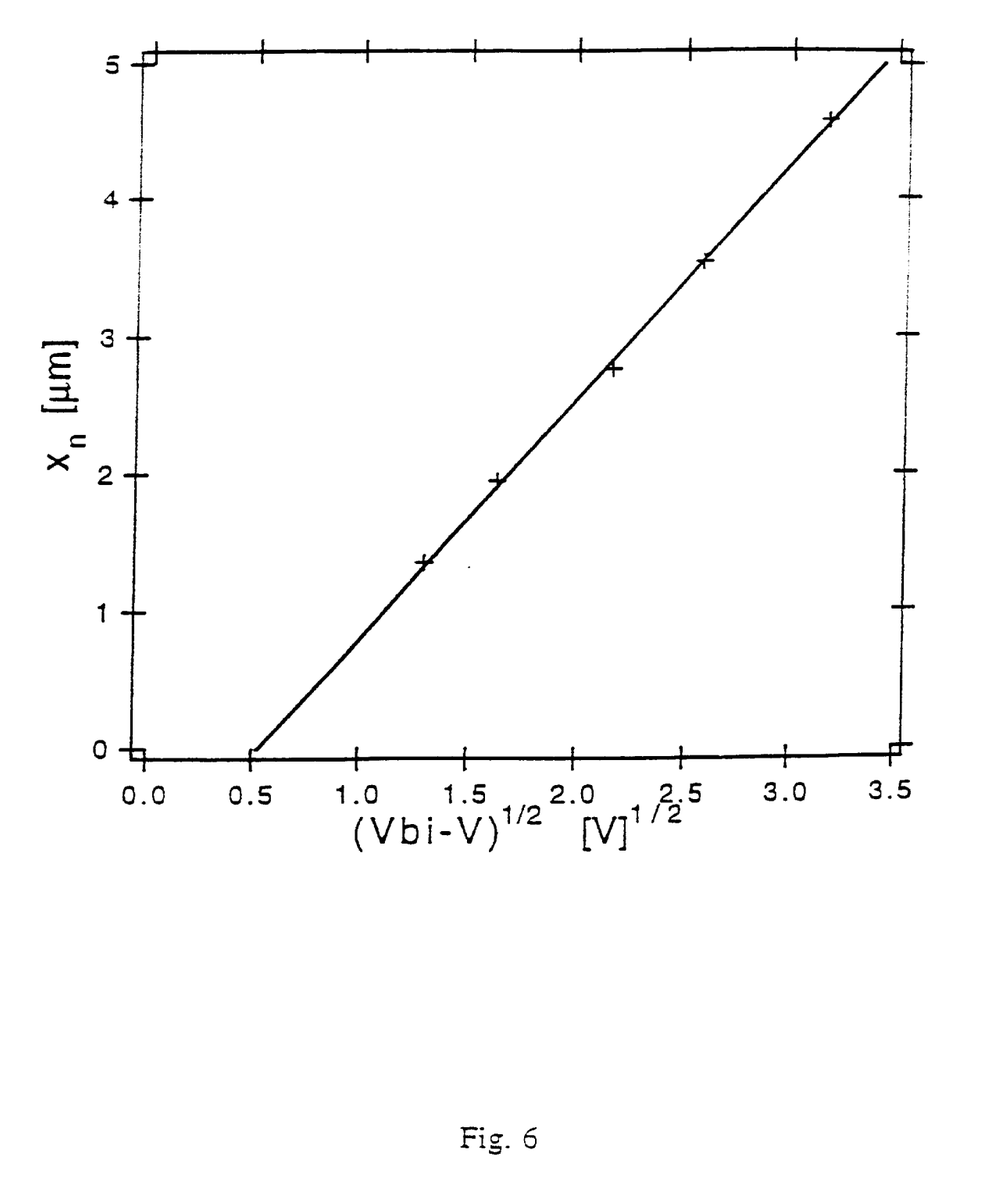
FIG. 6 shows a graph of the extent of the depletion layer versus applied voltage according to the measurements on the p-n junction shown in FIG. 5.

In FIG. 6 the extension of the depletion layer was plotted versus the square root of the applied reverse bias plus a theoretical value of 0.7 Volt $V_{bi}$. The straight line connecting the data points indicates the agreement between the experiment and theory for an abrupt junction.

A second example, illustrating some of the 2D possibilities of the present invention follows. Again, the electrical potential distribution to be measured on the semiconductor element, is caused by voltages applied to conductors attached to the semiconductor element.

The semiconductor sample was prepared as follows: a 20 keV boron implantation with a dose of $2 \times 10^{15}$ atoms/cm$^2$ was performed into a standard n-type substrate and annealed in an N2 atmosphere for 30 min at 900° C. This results in a two-dimensional diode structure with an electrical junction depth of about 400 nm and a maximum doping concentration of $5 \times 10^{19}/cm^3$ in the implanted layer. Further sample preparation may be done as described for the first example.

Figure 7:
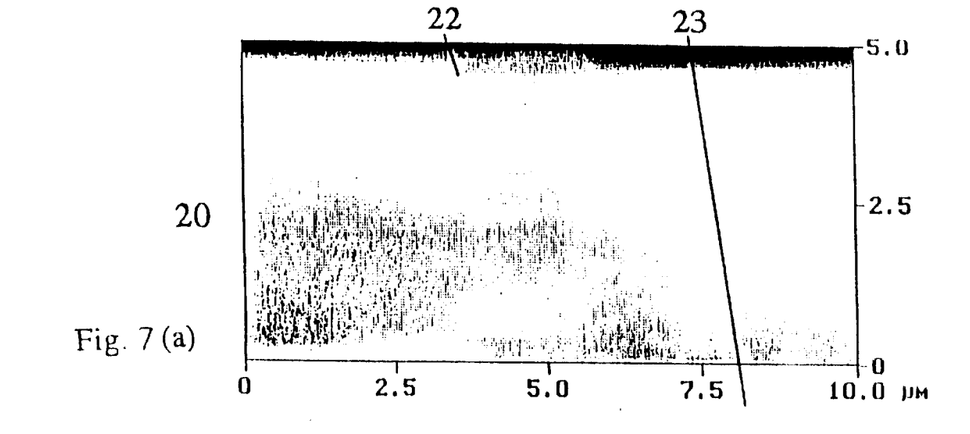
FIGS. 7(a)–7(d) are graphs of the two-dimensional potential distribution results, measured on a p+-implantation in an n-type silicon substrate.

FIGS. 7(a)–7(b) are grey scale representations of the simultaneously measured topography (20) and potential distribution (21) of a cross section of this semiconductor element. On the left part (22) of the topography image the non-implanted region is visible through the thick implantation mask. Dark areas represent the side walls of the semiconductor element, which correspond to part of the grooves where the implantation was performed into. At the right part (23) of the potential map the expected diode characteristic is revealed for the implanted region.

Alternative modes of carrying out the invention include the following options, they can be used separately or in combination with each other.

Measurements can be performed on one of the surfaces of the semiconductor element, by preference the top surface and/or on a cross section of the semiconductor element. The latter requires a cross section preparation, which can be done by cutting, and/or cleaving, and/or (chemical) mechanical polishing with different grain size abrasive papers, and/or focused ion beam cutting, combined with surface cleaning steps. Sections under certain angles known as bevelled sections to people skilled in the art may be applied in order to achieve geometrical enlargement of the measurement surface of the semiconductor element.

When the potential distribution to be measured is caused by applying voltages to conductors attached to the semiconductor element, different ways of arranging the conductors to the semiconductor element are possible. In addition to the ultrasonically soldered conductors mentioned in example one direct bonding of e.g. Al or Au wires to the semiconductor element or to existing bond pads is a preferred way of arranging the conductors to the semiconductor element due to process compatibility. The use of liquid solder (GaIn-eutectic) or fabrication of Pt-micro contacts by a FIB machine are other alternatives.

Two or more probes can be used simultaneously, replacing the single probe, each of them having their own voltage measurement unit and force control unit.

The potential distribution of the semiconductor element can be modulated by focusing light on it, and/or by adding an AC voltage to the DC settings of all or part of the conductors placed against the semiconductor element. A lock-in technique can then be used to measure the resulting modulated potential on the probe(s).

Instead of keeping the distance and/or the force or pressure force between the probe and the semiconductor element constant, the so-called tapping mode technique can be used: the probe is oscillated in the direction perpendicular to the semiconductor element. The frequency can be close to its resonant frequency, touching the semiconductor element periodically. During the touch-down of the probe the potential on the probe is measured. This tapping mode technique alleviates the problem of sustaining the force during the contact of the probe with the semiconductor element and the abrasive or shear force during the lateral scanning. Thus there is a shift from the pure contact mode towards an intermittent contact ("tapping"). In this case the probe is oscillating above the sample surface and only hits the surface at the end of an oscillation cycle. Changes in topography of the semiconductor element will lead to the probe hitting the sample sooner (longer) or later which determines a change in oscillation amplitude. Hence the latter can be used to probe surface topography of the semiconductor element. Due to the very short interaction time the tip of the probe is not subjected to any (abrasive) shear force and thus tips with a much higher aspect ratio and smaller tip radius can be used. In the tapping mode it may be required to construct a different detection scheme as the potential on the tip will be modulated by the oscillation frequency and its residence time on the sample surface. Note that the residence time depends on the oscillation amplitude and the force used during the measurement and also on the topography of the sample. The advantages of working in this tapping mode are that fine tapping tips can be used and that tip wear can be reduced. The tip radius may reduce below the 10 nm range. One concept of working with the tapping mode technique according to the present invention is to use an electrically isolated tip of the probe which is charged or (de) charged when the probe tip is in contact with the semiconductor element. Through the measurement of the charge put (removed) on (from) the probe tip one then has a measurement related to the potential at the point of impact. The latter can be executed with a detection circuit very similar to the one used in Scanning Capacitance Microscopy. An alternative of working with the tapping mode technique according to the present invention would be to still use the probe as voltage probe whereby the the voltage measured by the probe would be interpreted in terms of the potential on the sample and the convolution with the tip oscillation. It is to be noted that the changes in oscillation amplitude themselves are influenced by the electrostatic forces between the tip and the sample and thus constitute a signal proportional with the local potential. Hence an analysis of the changes in oscillation amplitude, phase and frequency may be a valuable concept as well.

Superposed to the movement of the probe across the semiconductor element, the probe can be oscillated (small amplitude, e.g. 10 nm) across the sample. When a lock-in technique is used to measure the resulting potential on the probe, the gradient of the potential distribution is measured, i.e. the electrical field distribution on the surface of the semiconductor element.

Yet in another mode of carrying out the invention, the mode of carrying out the invention is executed as follows. According to this method, the invention provides a method for measuring the electrical potential distribution in a semiconductor element, comprising the steps of applying at least one voltage over the semiconductor element; placing at least one conductor in contact with the semiconductor element using a scanning proximity microscope while injecting a substantially zero current in the semiconductor element with the conductor; measuring the electrical potential on the conductor while injecting a substantially zero current in the semiconductor element with the conductor; and thereafter changing the position of the conductor in order to map the electrical potential distribution in the semiconductor element by measuring the electrical potential on said conductor at different positions on the semiconductor element.

Figure 8:
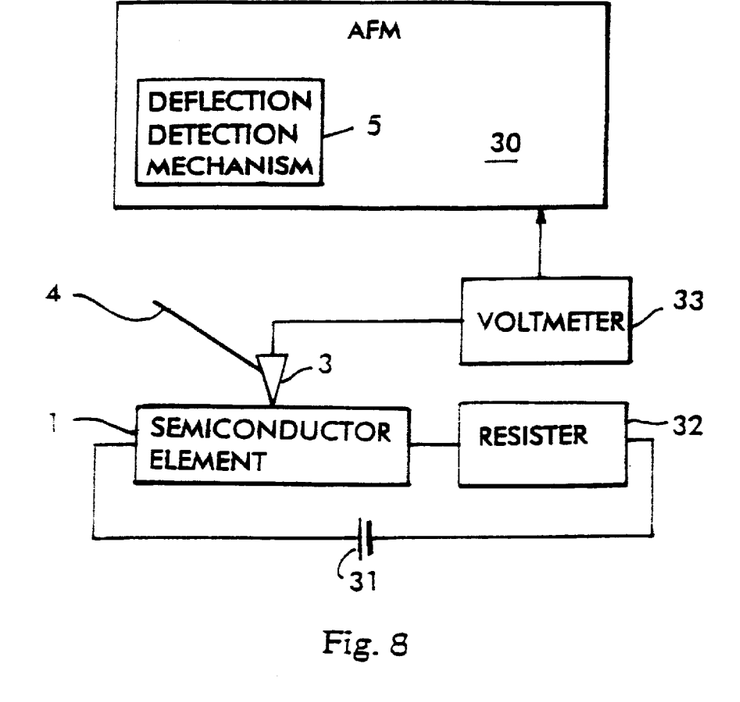
FIG. 8 is a schematic diagram of a measurement method using an AFM which can be used in carrying out another aspect of the invention.

Referring to FIG. 8, in an exemplary description of this mode of executing the invention, one can proceed as follows. Two electrical contacts (not shown) are defined on a semiconductor element (1), in this example a doped Si sample (1). The sample of the example is a (100) n-type sample with dimensions of 10 mm by 10 mm, a resistivity of 0.09–0.15 $\Omega$cm corresponding to a doping level of $10^{17}$ cm$^3$. This sample is homogeneously doped. The electrical contacts can be made using liquid GaIn eutectic combined with conductive silver paint. These electrical contacts allow for applying a voltage over the semiconductor element. This sample is mounted at the sample holder of an Atomic Force Microscope (AFM) arrangement (30), which may be the same as the AFM arrangement of FIG. 1, and electrical connections are made to a voltage source (31) and a resistor (32). This set-up should guarantee that the main voltage drop will occur across the resistor (32). Therefore, the applied voltage that will be present in the semiconductor sample in this particular example will be homogeneous and is 1.0V. A homogeneous signal as a result of the electrical potential distribution measurements therefore is expected.

Figures 9A, 9B:
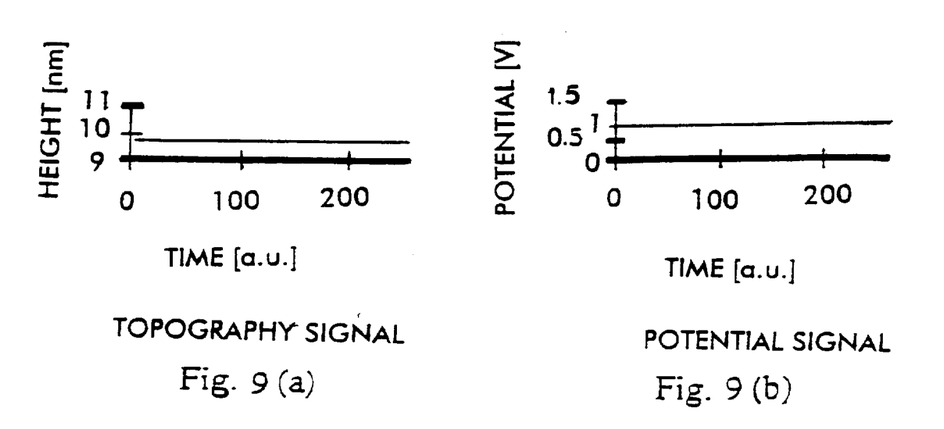
FIGS. 9(a) and 9(b) are graphs showing a topography and a potential signal, respectively, occurring during the measurement method of FIG. 8.

A probe (3) being in this example a Si tip coated with 100 nm boron doped diamond (specifications: force constant 42N/m, resonance frequency 330 kHz, length 125 $\mu$m, width 28±5 $\mu$m, height 10–15 $\mu$m, which may, for example, be provided by NANOSENSORS Dr. Olaf Wolter GmbH, Aidlingen, Germany is mounted at the AFM system (e.g. a Dimension 3000, Digital Instruments Inc., Santa Barbara, Calif.) and connected to a high impedance voltmeter (32) (e.g., a Keithley 617 electrometer, Keithley, Cleveland, Ohio). The output/readings of the voltmeter (33) are sent to the auxiliary voltage channel of the AFM system. Therefore, topography and potential data, as shown in FIGS. 9(*a*) and 9(*b*), respectively, can be imaged and stored simultaneously.

The AFM is used in contact mode which term is well known in the art and means that mechanical contact is established between the probe and the semiconductor element. After the necessary steps for preparing a contact mode measurement which is a standard procedure for topography imaging and well known in the art, a setpoint voltage (for example 0.1V) can be chosen for making a first contact. This setpoint voltage determines the desired cantilever deflection and consequently the contact force for executing the further measurements. It is to be noted that the probe (3) is attached to the cantilever (4) whose deflection is measured by the deflection detection mechanism (5). The cantilever deflection therefore can be held constant during the measurements. The step of establishing a setpoint voltage may be done according to the procedure described on pages 6-5 and 6-10 of the Dimension 3000 SPM Instrument Manual, 1996. The entire disclosure of such manual is incorporated by reference herein. The setpoint voltage for instance may determine the value of the z-parameter of the piezo crystal determining the position of the probe. In this particular example, by applying a setpoint voltage of 0.1V, a stable mechanical contact at the silicon sample can be observed, but no voltage can be measured with the probe (3). The probe (3) is then withdrawn and there is no longer contact between the probe (3) and the semiconductor element (1). As a next step, a setpoint voltage of for instance 0.5V is chosen for making a second contact between the probe and the silicon sample. A stable mechanical contact can be detected, but in addition a voltage signal (1 V as applied on the sample) is detected by the conductive probe as shown in the FIG. 9(b). This means that also electrical contact is made between the semiconductor element and the sample. In this way the calibration of the contact between the semiconductor element and probe thus means that a contact parameter value (the value of the setpoint voltage) is determined that allows the method of the invention to be executed in a reliable way.

The measurements are carried out in point contact mode. No scanning motion occurs, therefore the height of the topography should remain rather constant except for some experimental noise. The same holds for the potential signal. The time scales for the two graphs are identical as both signals are stored simultaneously. It is evident that when the experiment is carried out in scanning mode, the potential signal (FIG. 9b) will remain constant but the topography signal (FIG. 9a) will vary.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of measuring an electrical potential distribution in a semiconductor element, comprising the steps of:
   (a) applying at least one voltage over said semiconductor element;
   (b) placing at least one conductor in contact with said semiconductor element using a scanning proximity microscope while injecting a substantially zero current in said semiconductor element with said conductor;
   (c) measuring the electrical potential on said conductor while injecting a substantially zero current in said semiconductor element with said conductor;
   (d) changing the position of said conductor; and
   (e) repeating steps (c) and (d).

2. The method as recited in claim 1 further comprising the step of holding said conductor in contact with said semiconductor element while changing the position of said conductor.

3. The method as recited in claim 1 wherein said contact includes electrical and mechanical contact.

4. The method as recited in claim 3 further comprising the step of monitoring a contact parameter while executing steps (b)–(e).

5. The method as recited in claim 4 further comprising the step of calibrating said contact parameter, thereby obtaining at least one calibrated contact parameter value.

6. The method as recited in claim 4, wherein said contact parameter is contact force.

7. The method as recited in claim 5 further comprising the step of executing steps (b)–(e) at said calibrated contact parameter value.

8. The method as recited in claim 1 adapted for measuring said electrical potential on a cross-section of said semiconductor element.

9. The method as recited in claim 8, wherein said cross-section is formed by cleaving said semi-conductor element.

10. The method as recited in claim 8, wherein said cross-section is formed by polishing said semi-conductor element.

11. The method as recited in claim 8, wherein said cross-section is formed by chemical etching said semiconductor element.

12. The method as recited in claim 8, wherein said cross-section is formed by ion-beam milling said semiconductor element.

13. The method as recited in claim 8, wherein said cross-section is formed by sawing said semi-conductor element.

14. The method as recited in claim 8, wherein said cross-section is formed by sputter-etching said semiconductor element.

15. The method as recited in claim 8, wherein said cross-section is formed by bevel etching said semiconductor element.

16. The method as recited in claim 6, wherein said step of calibrating the contact force between said conductor and said semiconductor element comprises the steps of:
   placing said conductor in contact with said semiconductor element in a region with a known electrical potential;
   monitoring the electrical potential measured with said conductor; and
   increasing the contact force between said conductor and said semiconductor element until a first substantial change in the force characteristic of said conductor is recorded and until a first substantial change in said monitored electrical potential is recorded, whereby the monitored electrical potential attains substantially the same value as said known electrical potential, the corresponding contact force being the calibrated contact force.

17. The method as recited in claim 1, further comprising the step of:
   oscillating said conductor in a direction substantially perpendicular to the surface of said semiconductor element during step (c).

18. The method as recited in claim 1, wherein said voltage is applied by applying a voltage between two or more contacts arranged on said semiconductor element.

19. The method as recited in claim 1, wherein said voltage is applied by placing said semiconductor element in a magnetic field.

20. The method as recited in claim 1, wherein said voltage is applied by placing said semiconductor element in an electromagnetic field.

21. The method is recited in claim 1, wherein said voltage is applied by subjecting said semiconductor element to electromagnetic radiation.

22. The method as recited in claim 1, wherein said scanning proximity microscope is an atomic force microscope.

23. The method as recited in claim 1, wherein said conductor is an electrically conducting, relatively hard probe.

24. The method as recited in claim 23, wherein at least the tip of said probe is made of a material selected from the group consisting of diamond, boron implanted diamond, tungsten coated diamond, diamond-like-carbon, silicon, diamond-coated silicon, silicide-coated silicon, cubic boron-nitride and nitride-coated silicon.

25. The method as recited in claim 6, adapted for measuring a characteristic of said semiconductor element, further comprising the steps of:

establishing a relation between said electrical potential and said characteristic;

mapping the electrical potential distribution in said semiconductor element; and converting said potential distribution to said characteristic using said relation.

26. The method as recited in claim 25, wherein said characteristic is the charge carrier distribution in said semiconductor element.

27. The method as recited in claim 25, wherein said conductor is moved substantially perpendicular over a surface of said semiconductor element in which is situated a p-n junction.

28. A method of measuring an electrical potential distribution in a semiconductor element, comprising the steps of:

(a) applying at least one voltage over said semiconductor element;

(b) placing at least one conductor in contact with said semiconductor element using a scanning proximity microscope while injecting a substantially zero current in said semiconductor element with said conductor, thereby establishing a contact force between said conductor and said semiconductor element;

(c) calibrating said contact force between said conductor and said semiconductor element to thereby obtain a calibrated contact force; and thereafter (d) holding said conductor in contact with said semiconductor element while establishing said calibrated contact force between said conductor and said semiconductor element;

(e) measuring the electrical potential on said conductor while injecting a substantially zero current in said semiconductor element with said conductor;

(f) changing the position of said conductor; and (g) repeating steps (e) and (f).

29. A method of measuring an electrical potential distribution in a semiconductor element, comprising the steps of:

(a) applying at least one voltage over said semiconductor element;

(b) placing at least one conductor in contact with said semiconductor element using a scanning proximity microscope while injecting a substantially zero current in said semiconductor element with said conductor;

(c) measuring the electrical potential on said conductor while injecting a substantially zero current in said semiconductor element with said conductor;

(d) changing the position of said conductor;

(e) repeating steps (c) and (d);

(f) monitoring a contact parameter while executing steps (b)–(e);

(g) calibrating said contact parameter, thereby obtaining at least one calibrated contact parameter value;

(h) executing steps (b)–(e) at said calibrated contact parameter value;

(i) establishing a relation between said electrical potential and a characteristic of said semiconductor;

(j) mapping the electrical potential distribution in said semiconductor element; and (k) converting said potential distribution to said characteristic using said relation.

30. The method as recited in claim 29, wherein said conductor is moved substantially perpendicular over a surface of said semiconductor element in which is situated a p-n junction.

31. The method as recited in claim 29, wherein said semiconductor element comprises a transistor structure.

32. The method as recited in claim 1 wherein said transistor is fully or partially operational.

33. The method as recited in claim 31 wherein said transistor is fully or partially operational.

* * * * *